United States Patent
Chang et al.

(10) Patent No.: US 8,222,726 B2
(45) Date of Patent: Jul. 17, 2012

(54) SEMICONDUCTOR DEVICE PACKAGE HAVING A JUMPER CHIP AND METHOD OF FABRICATING THE SAME

(75) Inventors: Hsiao-Chuan Chang, Kaohsiung (TW); Tsung-Yueh Tsai, Kaohsiung (TW); Yi-Shao Lai, Yonghe (TW); Jiunn Chen, Kaohsiung (TW); Ming-Hsiang Cheng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 149 days.

(21) Appl. No.: 12/748,843

(22) Filed: Mar. 29, 2010

(65) Prior Publication Data
US 2011/0233749 A1 Sep. 29, 2011

(51) Int. Cl.
*H01L 21/50* (2006.01)
*H01L 23/48* (2006.01)
*H01L 21/44* (2006.01)

(52) U.S. Cl. ............ 257/690; 257/E23.01; 257/E21.499; 257/E21.476; 257/686; 257/685; 257/777; 257/723; 257/724; 257/728; 257/784; 257/786; 257/774; 257/773; 257/698; 257/696

(58) Field of Classification Search .................. 257/690, 257/E21.476, E23.01, E21.499, 686, 685, 257/777, 723, 724, 728, 784, 786, 774, 773, 257/698, 696
See application file for complete search history.

(56) References Cited

U.S. PATENT DOCUMENTS

| | | | | |
|---|---|---|---|---|
| 5,875,100 A * | 2/1999 | Yamashita | ............... | 361/764 |
| 6,731,015 B2 * | 5/2004 | Wu et al. | .............. | 257/796 |
| 6,867,486 B2 * | 3/2005 | Hong | .................. | 257/686 |
| 7,064,006 B2 * | 6/2006 | Akram | ..................... | 438/109 |
| 7,224,055 B2 * | 5/2007 | Kim et al. | ............... | 257/686 |
| 8,030,675 B2 * | 10/2011 | Inoguchi | ................ | 257/98 |
| 2004/0123256 A1 * | 6/2004 | Van Den Berghe et al. | ...... | 716/4 |
| 2006/0065972 A1 * | 3/2006 | Khan et al. | .............. | 257/712 |
| 2007/0158826 A1 * | 7/2007 | Sakakibara et al. | .......... | 257/723 |
| 2007/0224731 A1 * | 9/2007 | Sunohara et al. | ............ | 438/108 |
| 2007/0278648 A1 * | 12/2007 | Akram | ................. | 257/686 |
| 2008/0197474 A1 * | 8/2008 | Yang et al. | ................. | 257/690 |
| 2008/0274593 A1 * | 11/2008 | Yang et al. | ................. | 438/113 |
| 2009/0145649 A1 * | 6/2009 | Horiuchi et al. | .............. | 174/260 |
| 2009/0230526 A1 * | 9/2009 | Chen et al. | .................. | 257/676 |
| 2009/0230564 A1 * | 9/2009 | Tsai et al. | ..................... | 257/777 |
| 2009/0321921 A1 * | 12/2009 | Hwang | ............................ | 257/701 |
| 2011/0156243 A1 * | 6/2011 | Chang et al. | ................. | 257/702 |
| 2011/0156739 A1 * | 6/2011 | Chang et al. | ............ | 324/756.02 |
| 2011/0285284 A1 * | 11/2011 | Zhou et al. | ...................... | 315/32 |

* cited by examiner

*Primary Examiner* — A O Williams
(74) *Attorney, Agent, or Firm* — Muncy, Geissler, Olds & Lowe, PLLC

(57) ABSTRACT

A semiconductor device package and a method of fabricating the same are provided. The semiconductor device package includes a substrate, a first chip, a jumper chip, a plurality of first bonding wires and a plurality of second bonding wires. The substrate has a plurality of contact pads. The first chip is disposed and electrically connected to the substrate via the first bonding wires. The jumper chip is disposed on the first chip and has a plurality of metal pads. Each of the metal pads is electrically connected to two contact pads of the substrate via two second bonding wires, respectively.

16 Claims, 5 Drawing Sheets

SEMICONDUCTOR DEVICE PACKAGE HAVING A JUMPER CHIP AND METHOD OF FABRICATING THE SAME

BACKGROUND OF THE INVENTION

1. Field of the Invention

The invention relates in general to a device package, and more particularly to a semiconductor device package.

2. Description of the Related Art

With the trend of miniature of electronic devices, the relative technologies are evolving to fit the requirements of the market. Especially the semiconductor industry, which is almost closely linked to all kinds of electronic devices, has been developing techniques for producing more delicate semiconductor device package. However, the yield and quality of the semiconductor device package are still limited due to the small size and the fragile feature of the semiconductor chip itself.

For example, the interconnection structure within a semiconductor device package usually consists of bonding wires, pads, bumps and solder balls. When necessary, the bonding wires unavoidably have to be disposed over a semiconductor chip, which weakens the bonding wires and makes them incline to being in contact with the chip or other bonding wires. As a result, the interference between different components of the semiconductor device package is incurred, deteriorating the semiconductor device package and directly or indirectly affecting the yield and quality of the relative products.

SUMMARY OF THE INVENTION

The invention is directed to provide a semiconductor device package and a method of fabricating the same for providing a support and connection for bonding wires between two wire bonding pads and suitable for mass production.

According to a first aspect of the present invention, a semiconductor device package is provided including a substrate, a first chip, a jumper chip, a plurality of first bonding wires and a plurality of second bonding wires. The substrate has a plurality of contact pads. The first chip is disposed and electrically connected to the substrate via the first bonding wires. The jumper chip is disposed on the first chip and has a plurality of metal pads. Each of the metal pads is electrically connected to two contact pads of the substrate via two second bonding wires, respectively.

According to a second aspect of the present invention, a method of fabricating a semiconductor device package is provided. The method includes the steps of: disposing a first chip to a substrate having a plurality of contact pads; disposing a jumper chip having a plurality of metal pads to the first chip; electrically connecting the first chip and the substrate via a plurality of first bonding wires; and, electrically connecting the metal pads to the contact pads via a plurality of second bonding wires.

According to a third aspect of the present invention, a method for fabricating a jumper chip having metal pads is provided. The method includes the steps of: forming an electrically insulating layer on a base; forming a metal layer on the electrically insulating layer; and partially removing the metal layer, the electrically insulating layer and the base for forming the jumper chip having the metal pads.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
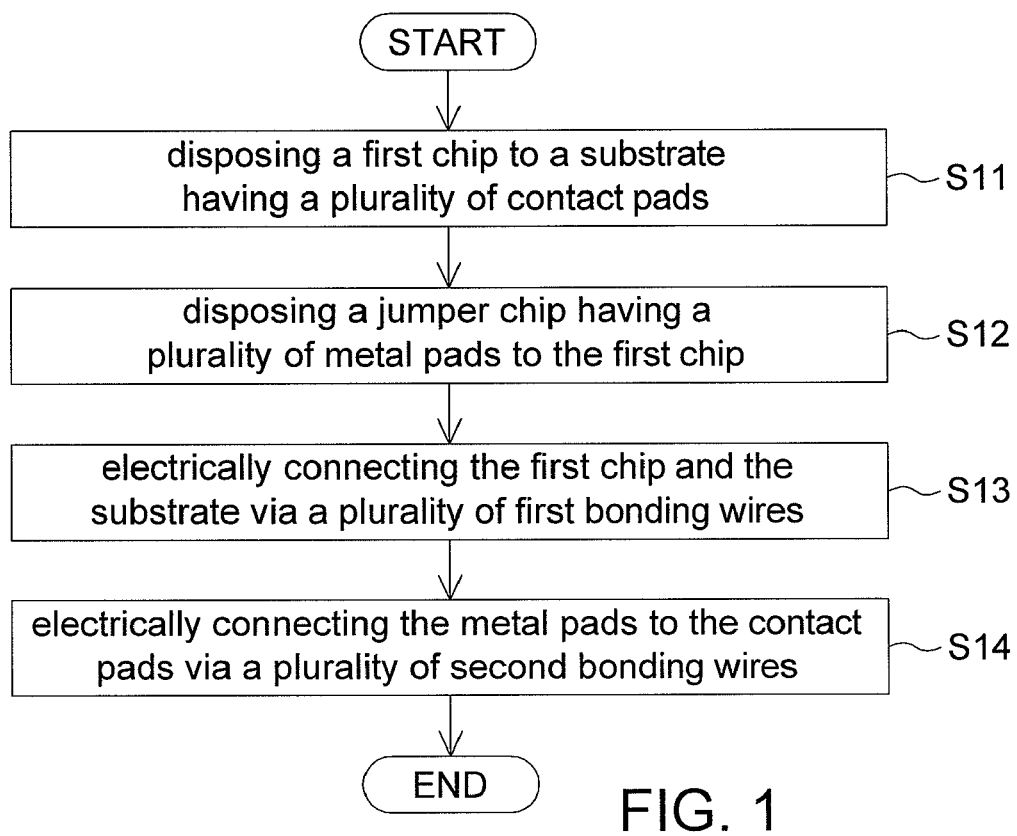
FIG. 1 shows a flowchart of a method of fabricating a semiconductor device package according to a preferred embodiment of the invention.

FIG. 1 shows a flowchart of a method of fabricating a semiconductor device package according to a preferred embodiment of the invention. FIGS. 2A to 2E show the fabrication of a semiconductor device package in accordance with the steps of the method of FIG. 1. The method includes steps S11 to S14.

Figure 2A:
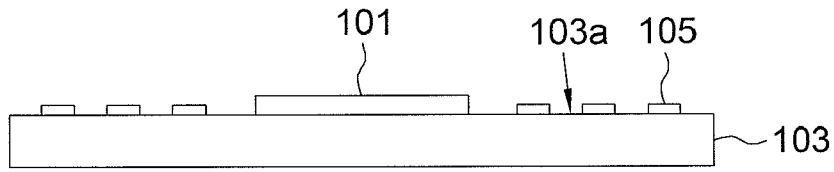
FIGS. 2A to 2E show the fabrication of a semiconductor device package in accordance with the steps of the method of FIG. 1.

As shown in step S11 and FIG. 2A, a first chip 101 is disposed to a substrate 103 having a plurality of contact pads 105. The first chip and the contact pads 105 are preferably both disposed on the upper surface 103a of the substrate 103.

Figure 2B:
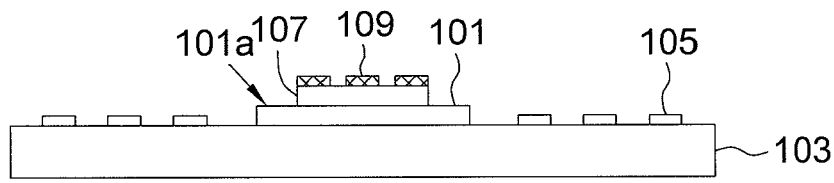

Then, as shown in step S12 and FIG. 2B, a jumper chip 107 having a plurality of metal pads 109 is disposed to the first chip 101. The jumper chip 107 is disposed on the upper surface 101a of the first chip 101.

Figure 2C:
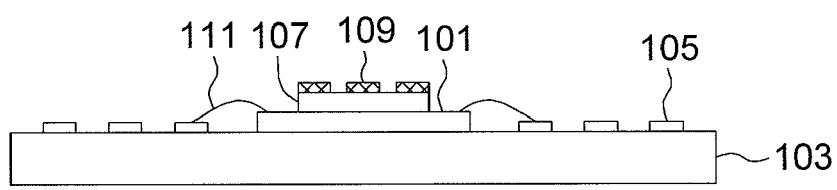

Next, as shown in step S13 and FIG. 2C, the first chip 101 is electrically connected to the substrate 103 via a plurality of first bonding wires 111. The first bonding wires 111 are golden wires, for example, for providing the signal communication path between the first chip 101 and the substrate 103.

Figure 2D:
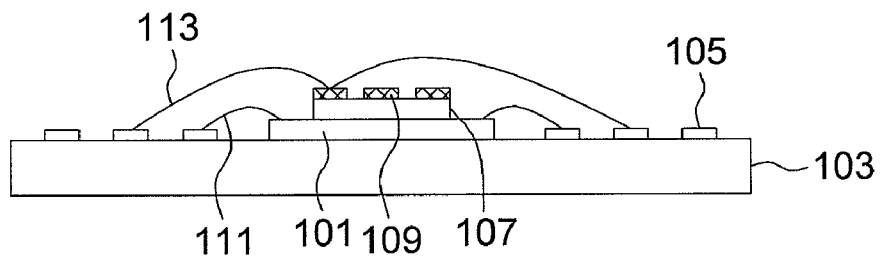

Then, as shown in step S14 and FIG. 2D, the metal pads 109 are electrically connected to the contact pads 105 via a plurality of second bonding wires 113. The second bonding wires 113 are golden wires for providing the signal communication path between the jumper chip 107 and the substrate 103.

Figure 2E:
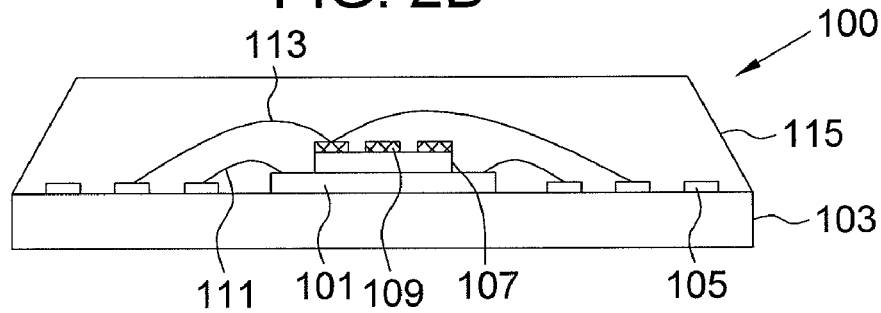

After that, selectively, as shown in FIG. 2E, a package compound 115 is applied to the substrate 103 for sealing the first chip 101, the jumper chip 107, the first bonding wires 111 and the second bonding wires 113, so as to protect the whole structure. Herein the fabrication of a semiconductor device package 100 is completed.

Figure 3A:
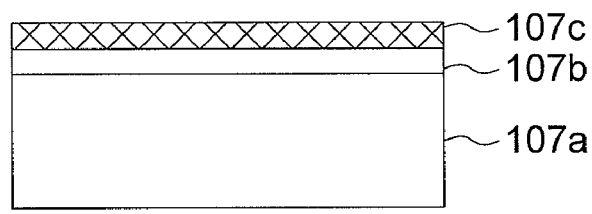
FIGS. 3A to 3B show the formation of the jumper chip.
Figure 3B:
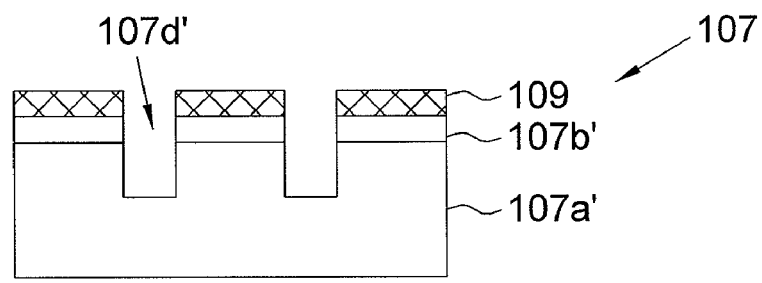
Figure 3C:
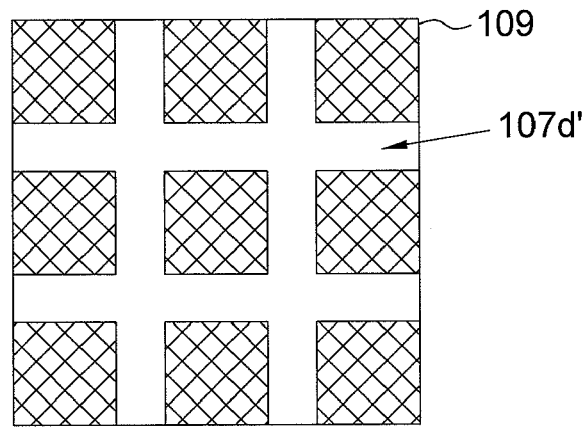
FIG. 3C shows the top view of FIG. 3B.

The jumper chip 107 is prepared in advance of the assembly to the first chip 101, and its fabrication is elaborated in the following. FIGS. 3A to 3B show the formation of the jumper chip, and FIG. 3C shows the top view of FIG. 3B. As shown in FIG. 3A, a base 107a is provided first. The base 107a is a silicon wafer or other semiconductor base. An electrically insulating layer 107b and a metal layer 107c are sequentially formed on the base 107a, wherein the electrically insulating layer 107b is used for preventing the interference between the metal layer 107a and the base 107a.

Then, as shown in FIG. 3B and FIG. 3C, the metal layer 107c and the electrically insulating layer 107b are partially removed for forming a jumper chip 107 having a plurality of metal pads 109 and a plurality of electrically insulating layers 107b'. As the base 107a is a wafer base, the removing step can be performed by partially sawing the base 107a, the electrically insulating layer 107b and the metal layer 107c (shown in FIG. 3A) to form a base 107a' and a plurality of trenches 107d' that separate the metal pads 109, as shown in FIG. 3B. The metal pads 109 are preferably arranged in the form of a matrix, as shown in FIG. 3C, for providing a more flexible wire-connection choice to the semiconductor device package.

Figure 4A:
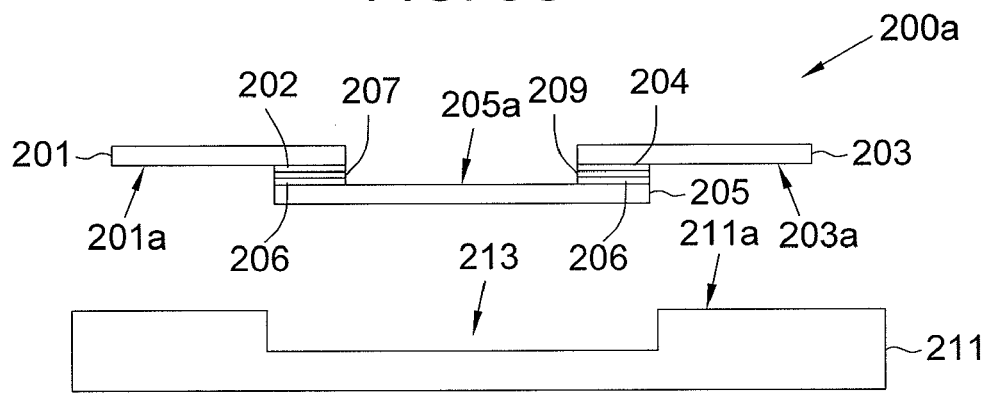
FIGS. 4A to 4G show the fabrication of another semiconductor device package in accordance with the steps of the method of FIG. 1.

FIGS. 4A to 4G show the fabrication of another semiconductor device package in accordance with the steps of the method of FIG. 1. As shown in FIG. 4A, two active chips 201 and 203 are mechanically disposed and electrically connected to a first chip 205 for forming a chip subassembly 200a. The first chip 205 is bridging the two active chips 201 and 203 and has an active surface 205a facing and partially overlapped with the active surfaces 201a and 203a of the active chips 201 and 203. Preferably, the active chips 201 and 203 are connected to the first chip 205 by two adhesion layers 207 and 209.

The active chips 201, 203 and the first chip 205 each have a plurality of signal pads 202, 204 and 206 on their active surfaces, and the signal pads 202 and 204 of the active chips 201, 203 are disposed corresponding to and close to the signal pads 206 of the first chip 205, such that there is capacitance effect generated between a pair of the signal pads of the active chips 201 and 203 and the first chip 205 because the signal pads of the active chips 201 and 203 are capacitively or inductively coupled to the signal pads of the first chip 205, which provides the signal communication between the active chips 201, 203 and the first chip 205.

Figure 4B:
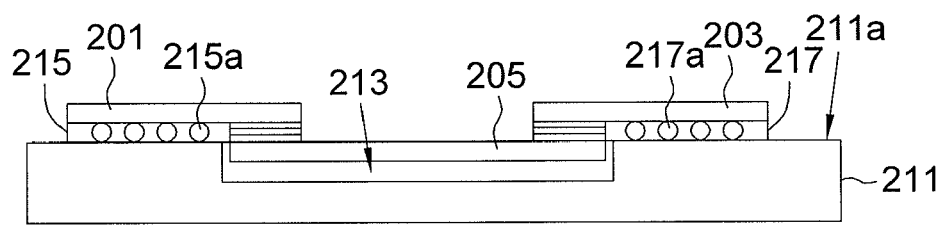

The chip subassembly 200a is going to be assembled to a substrate 211. Preferably, the substrate 211 has a cavity 213 located on its upper surface 211a for receiving the first chip 205. As shown in FIG. 4B, the active chips 201 and 203 are mechanically and electrically connected to contacts or pads (not shown) on the upper surface 211a of the substrate 211 via solder bumps 215a and 217a, respectively. The gap between the chips and the substrate is sealed by an underfill 215 and 217 thereby strengthening and stabilizing the interconnection between the chips and the substrate and increasing the solder joint reliability between the chips and the substrate.

Alternatively, the active chips 201 and 203 may be mechanically and electrically connected to the upper surface 211a via metal bumps preformed on the bonding pads of the chips and an anisotropic conductive adhesive film (ACF). One type of anisotropic adhesive suitable for forming the ACF is known as a "z-axis anisotropic adhesive". Z-axis anisotropic adhesives are filled with conductive particles to a low level such that the particles do not contact each other in the xy plane. Therefore, compression of the material in the z direction establishes an electrical path.

Figure 4C:
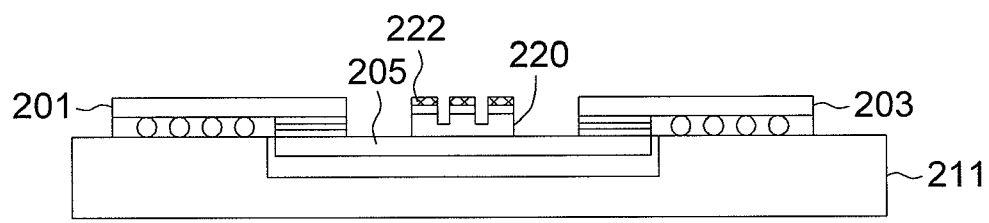
Figure 4D:
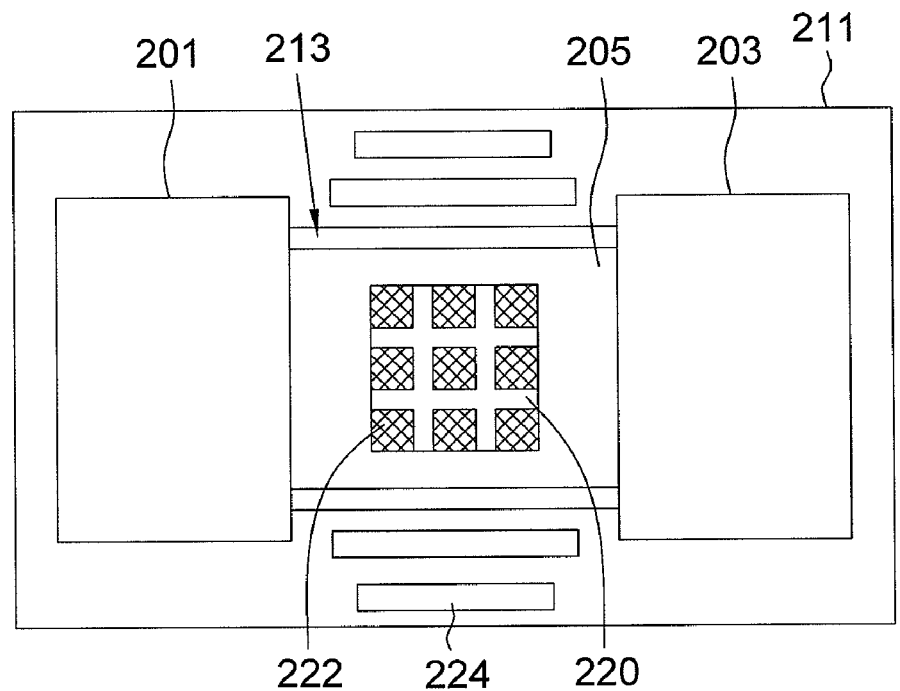

As shown in FIG. 4C, a jumper chip 220 having a plurality of metal pads 222 is then disposed on the first chip 205. FIG. 4D is the top view of the structure of FIG. 4C for better understanding of the following process. The metal pads 222 of the jumper chip 220 are preferably arranged in the form of a matrix. The substrate 211 further has a plurality of contact pads 224 disposed on the upper surface of the substrate 211. The contact pads 224 are disposed on two opposite sides of the cavity 213, and the first chip 205 and the jumper chip 220 are located between the contact pads 224.

Figure 4E:
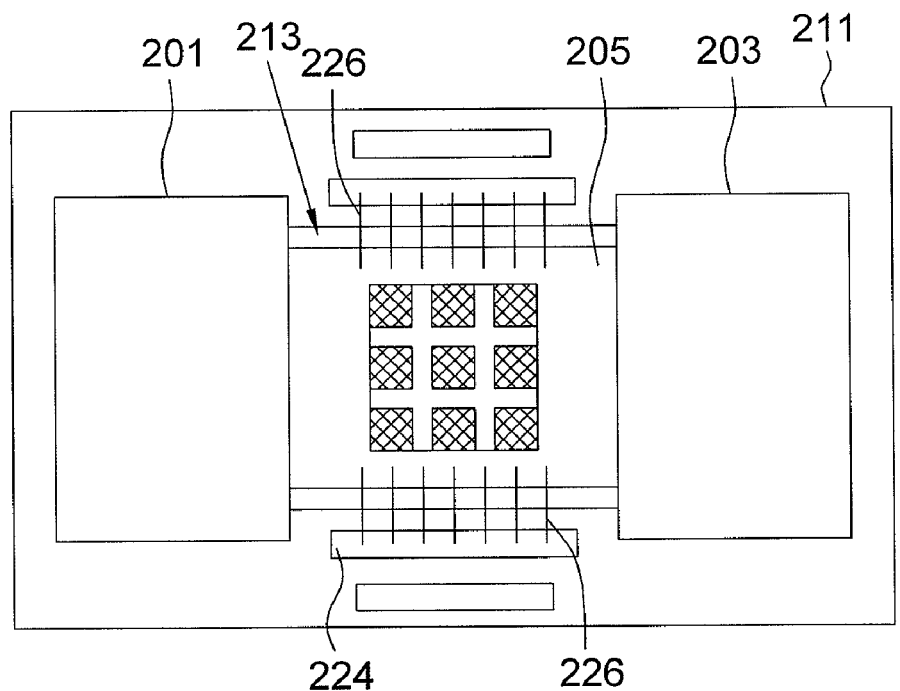
Figure 4F:
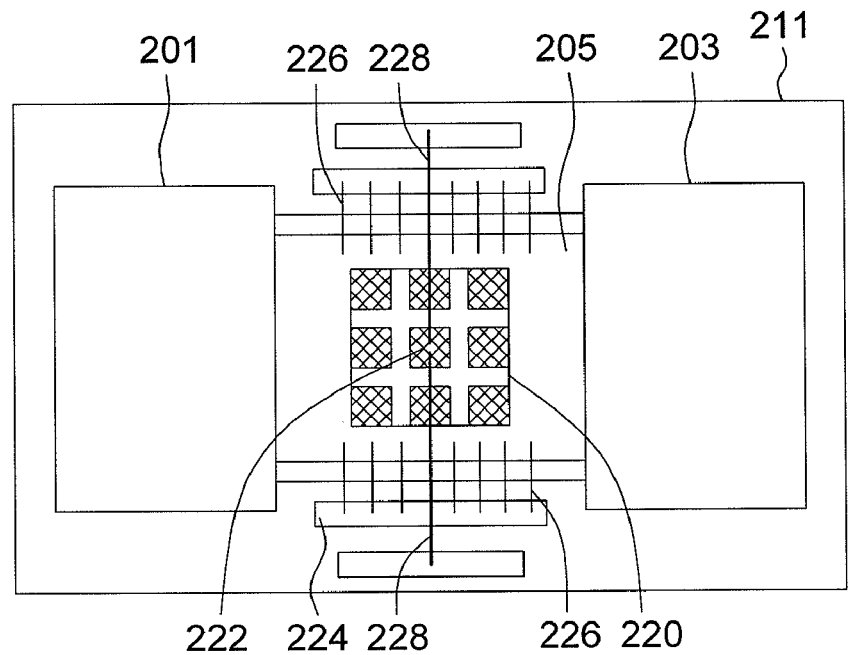

Then, as shown in FIG. 4E, a plurality of first bonding wires 226 are provided to electrically connect the first chip 205 to the contact pads 224 on the two opposite sides of the cavity 213. Next, as shown in FIG. 4F, a plurality of second bonding wires 228 are provided to electrically connect the metal pads 222 to the contact pads 224 of the substrate 211. The first and second bonding wires 226 and 228 are golden wires for example.

Figure 4G:
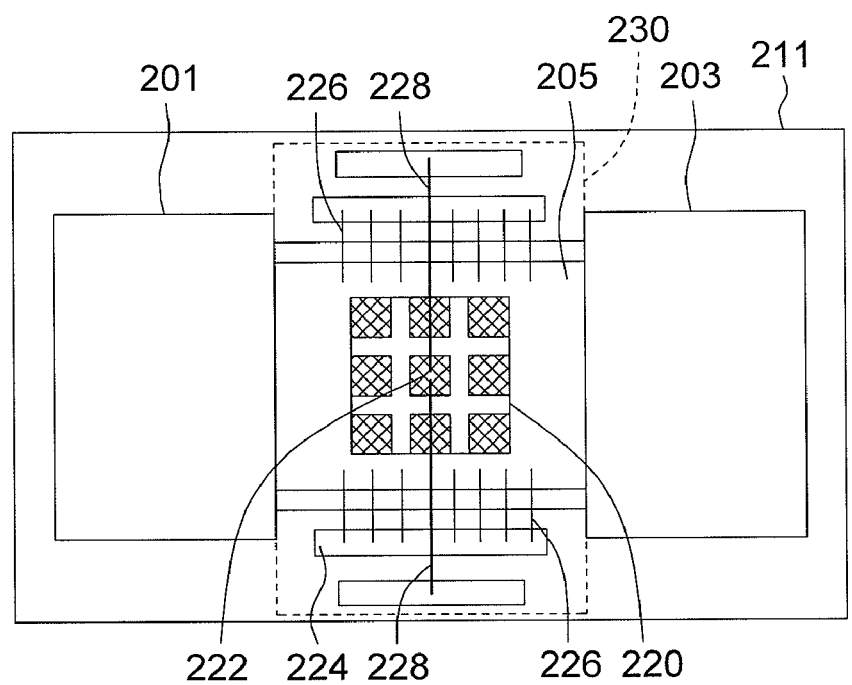

After that, as shown in FIG. 4G, a package compound 230 is applied to the substrate 211 for sealing the first chip 205, the jumper chip 220, the first bonding wires 226 and the second bonding wires 228.

The semiconductor device package and the method of fabricating the semiconductor device package according to the preferred embodiment of the invention are disclosed above. The semiconductor device package has a jumper chip disposed on a semiconductor chip of the semiconductor device and used as an intermediate chip for providing a support and connection for the bonding wires between different contact pads of the substrate. The jumper chip has a plurality of metal pads arranged in the form of a matrix, which enables the wire connection to be more flexible and steady. Besides, once a single jumper chip is assembled to the semiconductor chip, all of the metal pads are immediately installed, which is very suitable for mass production especially when the size of the semiconductor chip is too small. Therefore, the assembly of the semiconductor device package is facilitated, and accordingly, the yield and quality of the semiconductor device package are effectively increased.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device package, comprising:
   a substrate having a plurality of contact pads provided thereon;
   a first chip disposed and electrically connected to the substrate via a plurality of first bonding wires;
   a jumper chip disposed on the first chip and comprising a plurality of metal pads disposed on an upper surface of the jumper chip, wherein the metal pads of the jumper chip are separated by a plurality of trenches and disposed in the form of a matrix, each of the trenches has a bottom surface, the upper surface of the jumper chip is higher than the bottom surface of the trenches; and
   a plurality of second bonding wires;
   wherein each of the metal pads is electrically connected to two contact pads of the substrate via two second bonding wires, respectively.

2. The semiconductor device package according to claim 1, wherein the jumper chip further comprises a base and an electrically insulating layer, the electrically insulating layer is disposed between the base and the metal pads.

3. The semiconductor device package according to claim 2, wherein the base is a silicon wafer.

4. The semiconductor device package according to claim 1, wherein the substrate comprises a cavity, the semiconductor device package further comprises:
   two active chips mechanically disposed on and electrically connected to the substrate and around the cavity, wherein each of the active chips has a first active surface, the first chip disposed in the cavity and having a second active surface, wherein the second active surface is electrically connected to and partially overlapped with the first active surfaces, the jumper chip is disposed on the first chip.

5. The semiconductor device package according to claim 4, wherein
   each of the active chips has a plurality of first signal pads formed on the first active surface;

the first chip has a plurality of second signal pads formed on the second active surface;

at least some of the second signal pads of the first chip are capacitively coupled to at least some of the first signal pads of the active chips.

6. The semiconductor device package according to claim 1, further comprising:

a package compound for sealing the first chip, the jumper chip, the first bonding wires and the second bonding wires.

7. A semiconductor device package, comprising:

a substrate having a cavity and a plurality of contact pads provided thereon;

a first chip disposed in the cavity and electrically connected to the substrate via a plurality of first bonding wires;

a jumper chip disposed on the first chip and comprising a plurality of metal pads disposed thereon, wherein the metal pads of the jumper chip are separated by a plurality of trenches and disposed in the form of a matrix; and a plurality of second bonding wires;

wherein each of the metal pads is electrically connected to two contact pads of the substrate via two second bonding wires, respectively.

8. The semiconductor device package according to claim 7, further comprising:

two active chips mechanically disposed on and electrically connected to the substrate and around the cavity, wherein each of the active chips has a first active surface, wherein the first chip has a second active surface, the second active surface is electrically connected to and partially overlapped with the first active surfaces.

9. The semiconductor device package according to claim 8, wherein each of the active chips has a plurality of first signal pads formed on the first active surface.

10. The semiconductor device package according to claim 9, wherein the first chip has a plurality of second signal pads formed on the second active surface.

11. The semiconductor device package according to claim 10, wherein at least some of the second signal pads of the first chip are capacitively coupled to at least some of the first signal pads of the active chips.

12. The semiconductor device package according to claim 11, further comprising a pluralities of solder bumps disposed between the active chip and the substrate.

13. The semiconductor device package according to claim 12, further comprising an underfill for sealing the gap between the active chips and the substrate.

14. A semiconductor device package, comprising:

a substrate having a cavity and a plurality of contact pads provided thereon;

a first chip disposed in the cavity and electrically connected to the substrate via a plurality of first bonding wires;

a jumper chip disposed on the first chip and comprising a plurality of metal pads disposed thereon, wherein the metal pads are arranged in the form of a matrix; and a plurality of second bonding wires, wherein each of the metal pads is electrically connected to two contact pads of the substrate via two second bonding wires respectively, wherein the two contact pads of the substrate are disposed on two opposite sides of the cavity, the matrix formed metal pads are separated by a plurality of trenches.

15. The semiconductor device package according to claim 14, further comprising:

two active chips mechanically disposed on and electrically connected to the substrate and around the cavity, wherein each of the active chips has a first active surface; and a first chip disposed in the cavity and having a second active surface, wherein the second active surface is electrically connected to and partially overlapped with the first active surfaces.

16. The semiconductor device package according to claim 15, wherein each of the active chips has a plurality of first signal pads formed on the first active surface;

the first chip has a plurality of second signal pads formed on the second active surface;

at least some of the second signal pads of the first chip are capacitively coupled to at least some of the first signal pads of the active chips.

* * * * *